(12) United States Patent
Lee et al.

(10) Patent No.: US 9,117,812 B2
(45) Date of Patent: *Aug. 25, 2015

(54) SEMICONDUCTOR DEVICE AND METHOD OF FORMING NON-LINEAR INTERCONNECT LAYER WITH EXTENDED LENGTH FOR JOINT RELIABILITY

(71) Applicant: STATS ChipPAC, Ltd., Singapore (SG)

(72) Inventors: JaeHyun Lee, Kyungki-do (KR); KiYoun Jang, Kyoungki-do (KR); KyungHoon Lee, Kyunggi-Do (KR); TaeWoo Lee, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/138,382

(22) Filed: Dec. 23, 2013

(65) Prior Publication Data

US 2014/0103503 A1    Apr. 17, 2014

Related U.S. Application Data

(63) Continuation of application No. 13/417,034, filed on Mar. 9, 2012, now Pat. No. 8,642,384.

(51) Int. Cl.
*H01L 21/4763* (2006.01)
*H01L 23/12* (2006.01)
(Continued)

(52) U.S. Cl.
CPC ........ *H01L 23/49816* (2013.01); *H01L 21/486* (2013.01); *H01L 21/4814* (2013.01); *H01L 21/56* (2013.01); *H01L 21/76802* (2013.01); *H01L 21/76838* (2013.01); *H01L 23/3121* (2013.01); *H01L 23/3128* (2013.01); *H01L 23/3171* (2013.01); *H01L 23/49811* (2013.01); *H01L 23/49827* (2013.01); *H01L 23/49894* (2013.01); *H01L 23/5226* (2013.01); *H01L 23/5329* (2013.01); *H01L 24/16* (2013.01); *H01L 24/27* (2013.01); *H01L 24/81* (2013.01);
(Continued)

(58) Field of Classification Search
CPC ... H01L 23/49838; H01L 24/11; H01L 24/13; H01L 21/486; H01L 21/76877; H01L 24/14; H01L 24/81; H01L 21/76834; H01L 23/481; H01L 23/5226; H01L 23/5329; H01L 23/3128; H01L 23/3171; H01L 21/76807; H01L 21/76838; H01L 21/76802; H01L 24/97
See application file for complete search history.

(56) References Cited

U.S. PATENT DOCUMENTS 5,317,801 A    6/1994    Tanaka et al.
5,844,782 A    12/1998    Fukasawa (Continued)

*Primary Examiner* — Alonzo Chambliss
(74) *Attorney, Agent, or Firm* — Robert D. Atkins; Patent Law Group: Atkins and Associates, P.C.

(57) ABSTRACT

A semiconductor device has a substrate and first conductive layer formed over the substrate. An insulating layer is formed over the first substrate with an opening over the first conductive layer. A second conductive layer is formed within the opening of the insulating layer. A portion of the second conductive layer is removed to expose a horizontal surface and side surfaces of the second conductive layer below a surface of the insulating layer. The second conductive layer has non-linear surfaces to extend a contact area of the second conductive layer. The horizontal surface and side surfaces can be stepped surfaces or formed as a ring. A third conductive layer is formed over the second conductive layer. A plurality of bumps is formed over the horizontal surface and side surfaces of the second conductive layer. A semiconductor die is mounted to the substrate.

24 Claims, 11 Drawing Sheets

(51) Int. Cl.
*H01L 23/498* (2006.01)
*H01L 21/768* (2006.01)
*H01L 23/522* (2006.01)
*H01L 23/532* (2006.01)
*H01L 23/00* (2006.01)
*H01L 23/31* (2006.01)
*H01L 21/48* (2006.01)
*H01L 21/56* (2006.01)

(52) U.S. Cl.
CPC ............... *H01L 24/94* (2013.01); *H01L 24/97* (2013.01); *H01L 24/11* (2013.01); *H01L 24/13* (2013.01); *H01L 2224/0345* (2013.01); *H01L 2224/0346* (2013.01); *H01L 2224/03452* (2013.01); *H01L 2224/0401* (2013.01); *H01L 2224/05571* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1145* (2013.01); *H01L 2224/1146* (2013.01); *H01L 2224/11334* (2013.01); *H01L 2224/11849* (2013.01); *H01L 2224/13023* (2013.01); *H01L 2224/13111* (2013.01); *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16237* (2013.01); *H01L 2224/16245* (2013.01); *H01L 2224/48091* (2013.01); *H01L 2224/73265* (2013.01); *H01L 2224/81191* (2013.01); *H01L 2224/81203* (2013.01); *H01L 2224/81385* (2013.01); *H01L 2224/81815* (2013.01); *H01L 2224/94* (2013.01); *H01L 2224/97* (2013.01); *H01L 2924/00014* (2013.01); *H01L 2924/01322* (2013.01); *H01L 2924/12041* (2013.01); *H01L 2924/1306* (2013.01); *H01L 2924/13091* (2013.01)

(56) References Cited

U.S. PATENT DOCUMENTS

| | | |
|---|---|---|
| 5,872,399 A | 2/1999 | Lee |
| 5,943,597 A | 8/1999 | Kleffner et al. |
| 6,198,169 B1 | 3/2001 | Kobayashi et al. |
| 6,245,594 B1 * | 6/2001 | Wu et al. ................. 438/108 |
| 6,362,436 B1 | 3/2002 | Kimbara et al. |
| 6,462,414 B1 | 10/2002 | Anderson |
| 6,464,414 B1 | 10/2002 | Washnock |
| 6,486,053 B2 | 11/2002 | Yi et al. |
| 6,543,128 B2 | 4/2003 | Huang et al. |
| 7,544,599 B2 | 6/2009 | Hsu |
| 7,880,295 B2 | 2/2011 | Kikuchi et al. |
| 8,106,499 B2 | 1/2012 | Camacho et al. |
| 8,133,809 B2 * | 3/2012 | Mao ........................ 438/637 |
| 8,642,384 B2 * | 2/2014 | Lee et al. ................. 438/110 |
| 2005/0017375 A1 | 1/2005 | Ko et al. |
| 2006/0017160 A1 | 1/2006 | Huang et al. |
| 2006/0060956 A1 | 3/2006 | Tanikella |

* cited by examiner

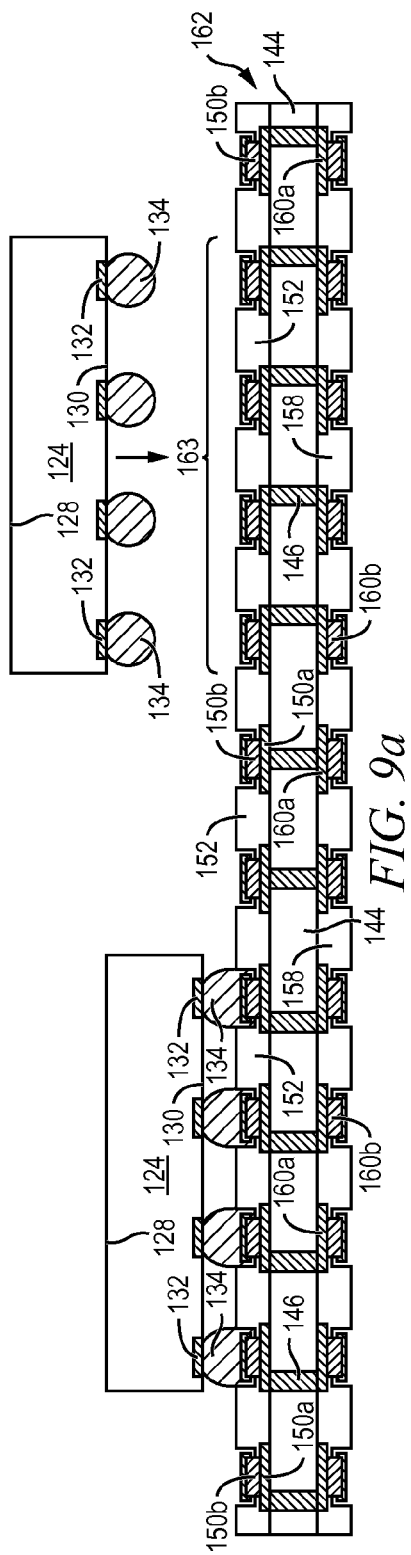
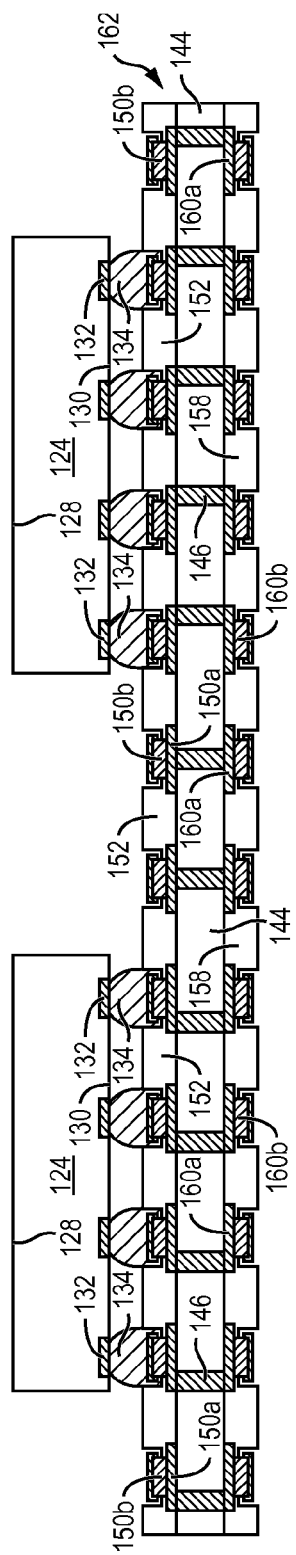
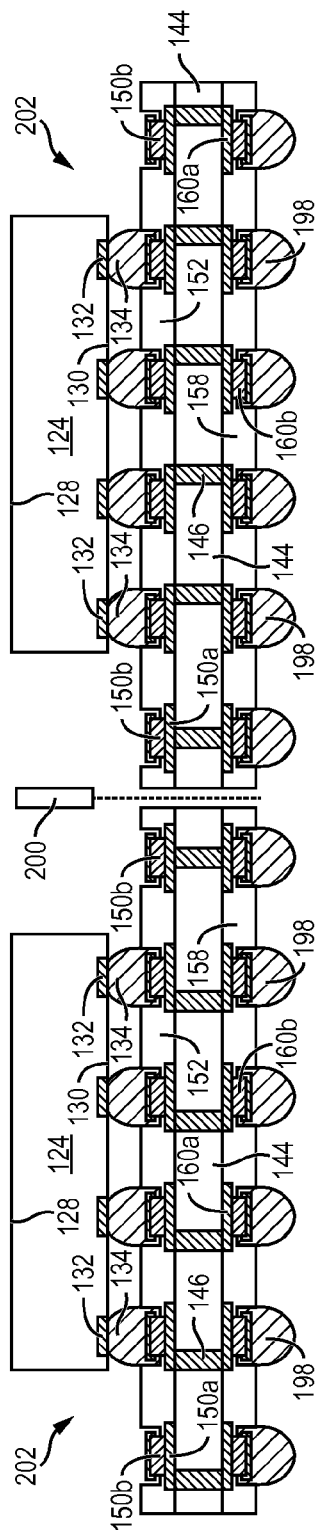
FIG. 9a
FIG. 9b
FIG. 9c

ID OF 9,117,812 B2

SEMICONDUCTOR DEVICE AND METHOD OF FORMING NON-LINEAR INTERCONNECT LAYER WITH EXTENDED LENGTH FOR JOINT RELIABILITY

CLAIM TO DOMESTIC PRIORITY

The present application is a continuation of U.S. Patent Application No. 13/417,034, now U.S. Pat. No. 8,642,384, filed Mar. 9, 2012, which application is incorporated herein by reference.

The present application is a continuation of U.S. patent application Ser. No. 13/417,034, filed Mar. 9, 2012, which application is incorporated herein by reference.

FIELD OF THE INVENTION

The present invention relates in general to semiconductor devices and, more particularly, to a semiconductor device and method of forming a non-linear interconnect layer with extended length for joint reliability.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1 shows a conventional semiconductor substrate 10 with conductive layer 12 operating as a bump contact pad. A photoresist layer 14 is formed over substrate 10. Conductive layer 12 is exposed from photoresist layer 14. Bump 16 is formed over a linear portion of conductive layer 12. PCB 20 includes photoresist layer 22 and conductive layer 24. Substrate 10 is mounted to PCB 20 with bump 16 electrically connected to conductive layer 24.

In applications with a high input/output (I/O) count and fine interconnect pitch, e.g., 0.32 millimeters (mm) or less, the linear contact surface area between conductive layer 12 and bump 16 is susceptible to cracking and other joint reliability problems. Poor joint reliability is primarily due to the reduced contact area between conductive layer 12 and bump 16 on the fine interconnect pitch substrate. The joint between conductive layer 12 and bump 16 can crack along the linear contact surface area.

SUMMARY OF THE INVENTION

A need exists to maintain joint reliability between bumps and conductive layers in fine pitch applications. Accordingly, in one embodiment, the present invention is a method of making a semiconductor device comprising the step of providing a first substrate. The first substrate includes a first conductive layer. The method further comprises the steps of forming an insulating layer over the first substrate, forming a second conductive layer within an opening of the insulating layer, and removing a portion of the second conductive layer below a surface of the insulating layer.

In another embodiment, the present invention is a method of making a semiconductor device comprising the step of providing a substrate. The substrate includes a first conductive layer. The method further comprises the steps of forming an insulating layer over the substrate, and forming a second conductive layer within an opening of the insulating layer including a non-linear surface extending a contact area of the second conductive layer.

In another embodiment, the present invention is a method of making a semiconductor device comprising the steps of providing a substrate, forming an insulating layer over the substrate, and forming a first conductive layer within an opening of the insulating layer below a surface of the insulating layer.

In another embodiment, the present invention is a semiconductor device comprising a substrate. An insulating layer is formed over the substrate. A first conductive layer is formed within an opening of the insulating layer below a surface of the insulating layer.

BRIEF DESCRIPTION OF THE DRAWINGS

FIGS. 9a-9c illustrate mounting a semiconductor die to the substrate over the extended length conductive layers.

DETAILED DESCRIPTION OF THE DRAWINGS

Figure 1:
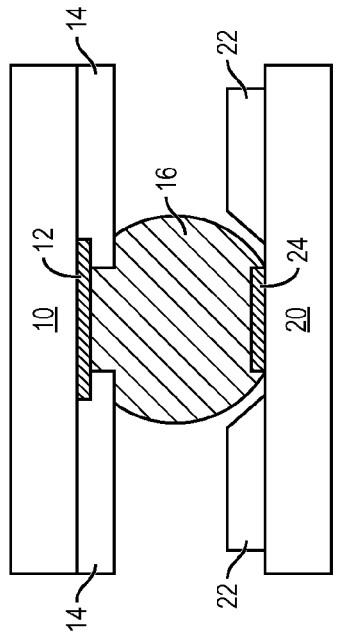
FIG. 1 illustrates a conventional semiconductor substrate with an interconnect structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
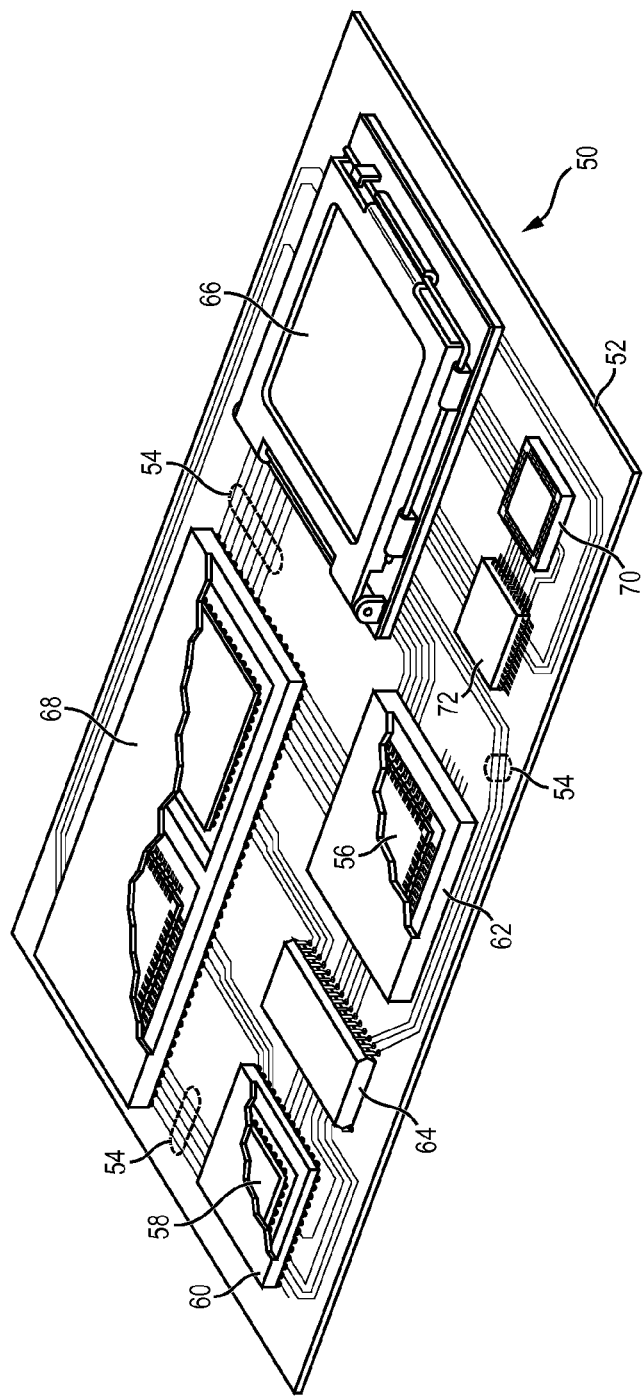
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
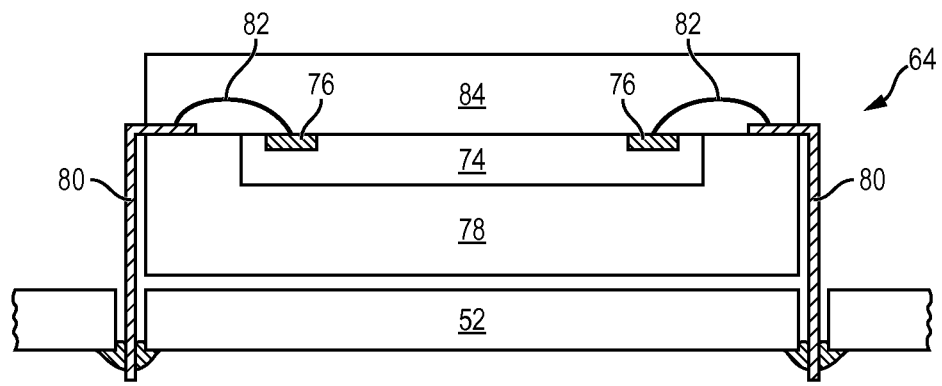
FIGS. 3a-3c illustrate further detail of the representative semiconductor packages mounted to the PCB.
Figure 3B:
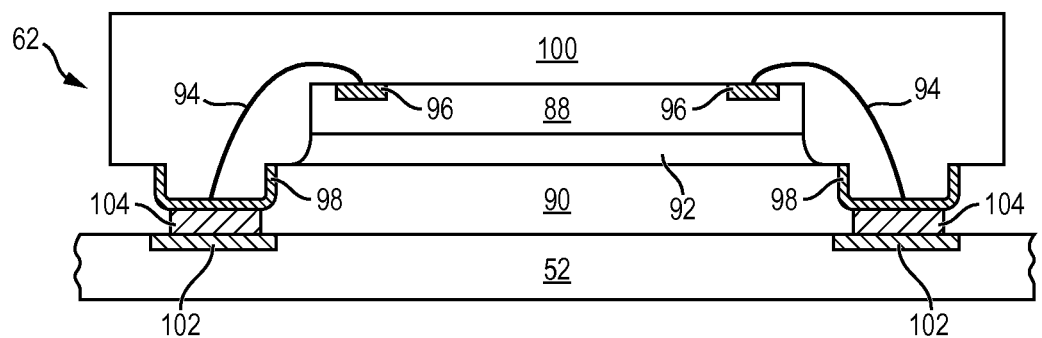
Figure 3C:
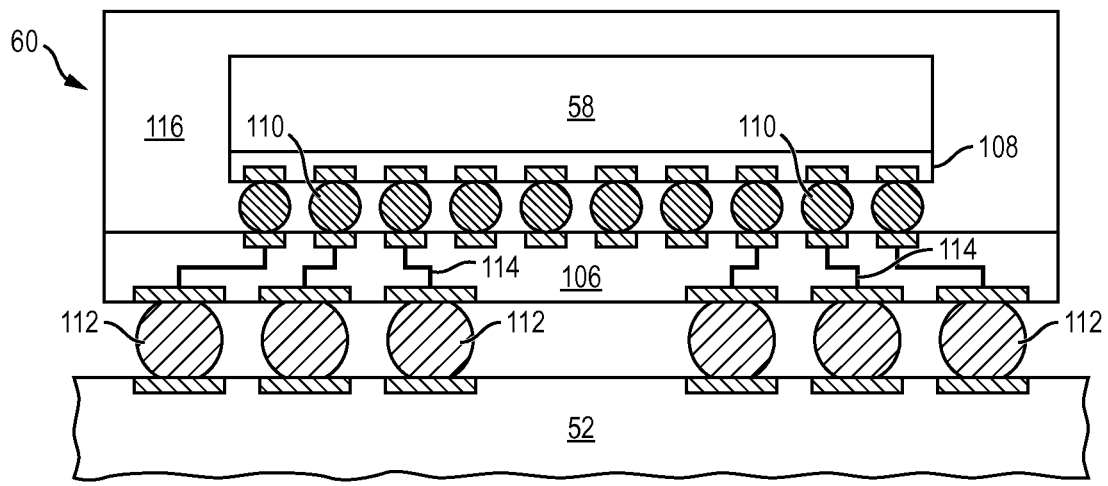

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
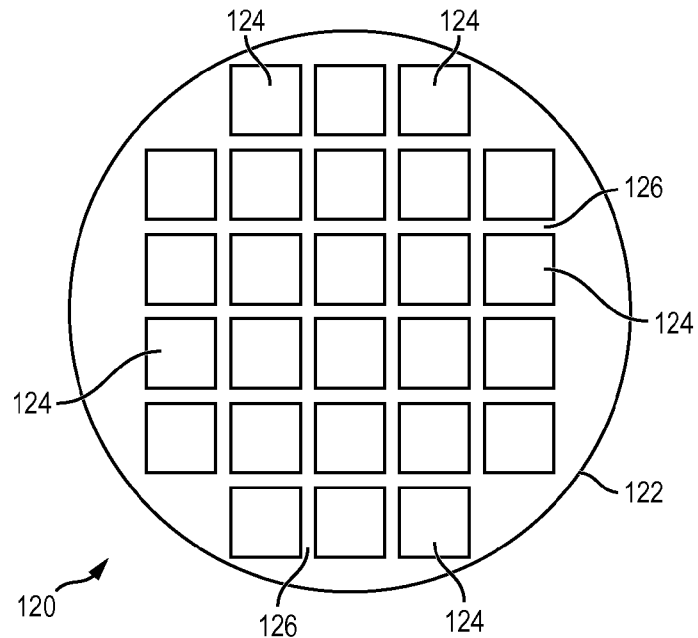
FIGS. 4a-4c illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
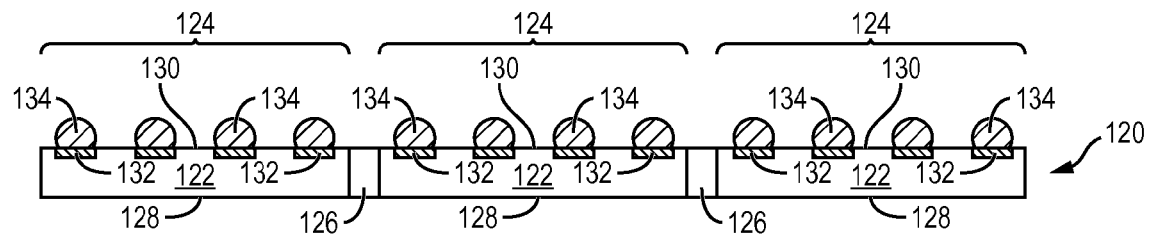

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded to contact pads 132. Bumps 134 represent one type of interconnect structure that can be formed over contact pads 132. The interconnect structure can also use stud bump, micro bump, or other electrical interconnect.

Figure 4C:
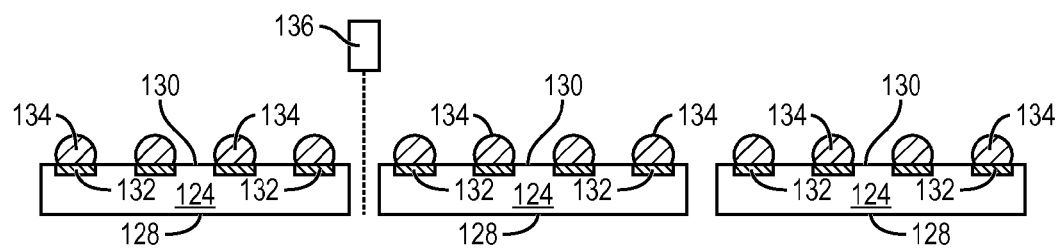

In FIG. 4c, semiconductor wafer 120 is singulated through saw street 126 using a saw blade or laser cutting tool 136 into individual semiconductor die 124.

Figure 5A:
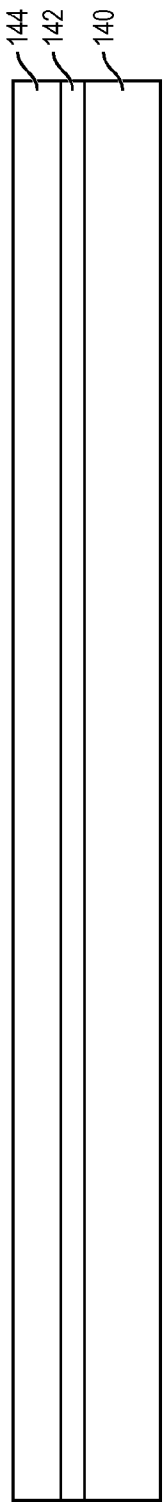
FIGS. 5a-5d illustrate a process of forming a substrate with vertical and horizontal conductive layers.

FIGS. 5a-5d illustrate a process of forming an interposer or substrate for vertical electrical interconnect of a semiconductor die. In FIG. 5a, a substrate or carrier 140 contains temporary or sacrificial base material such as silicon, germanium, gallium arsenide, indium phosphide, silicon carbide, resin, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer flexible laminate, ceramic, or leadframe. Substrate 144 is mounted to interface layer 142 over carrier 140.

Figure 5B:
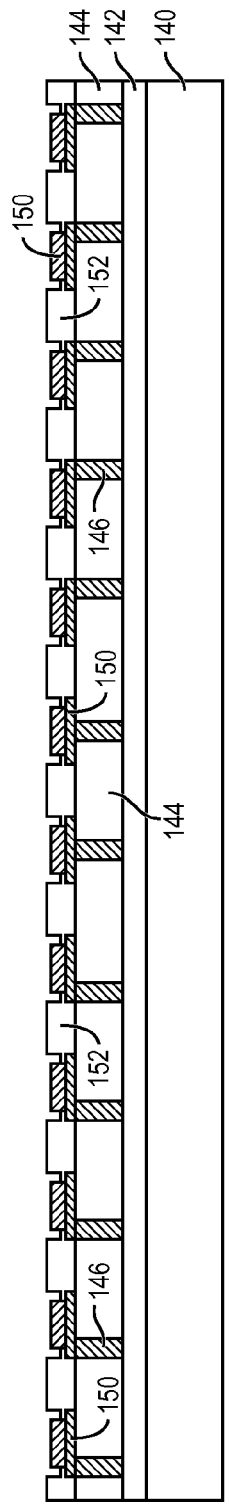

In FIG. 5b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An electrically conductive layer or RDL 150 is formed over substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

An insulating or passivation layer 152 is formed over a surface of substrate 144, conductive vias 146, and conductive layer 150 using PVD, CVD, printing, spin coating, spray coating, sintering or thermal oxidation. The insulating layer 152 contains one or more layers of silicon dioxide (SiO2), silicon nitride (Si3N4), silicon oxynitride (SiON), tantalum pentoxide (Ta2O5), aluminum oxide (Al2O3), photoresist, or other material having similar insulating and structural properties. Further detail of conductive layer 150 and insulating layer 152 is shown in FIGS. 6a-6f.

Figure 5C:
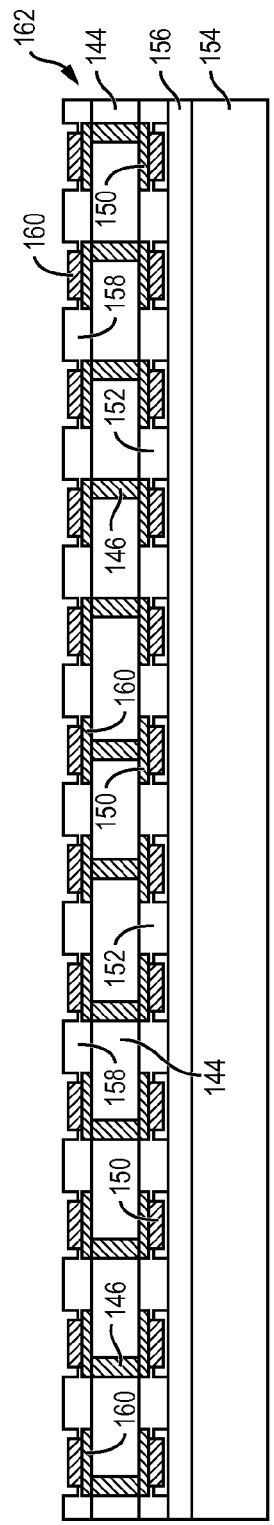

In FIG. 5c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 152 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 144 after forming conductive layers 150 and/or 160.

An insulating or passivation layer 158 is formed over substrate 144 and conductive layer 160 using PVD, CVD, printing, spin coating, spray coating, sintering or thermal oxidation. The insulating layer 158 contains one or more layers of SiO2, Si3N4, SiON, Ta2O5, Al2O3, photoresist, or other material having similar insulating and structural properties. Further detail of conductive layer 160 and insulating layer 158 is similar to FIGS. 6a-6f.

Figure 5D:
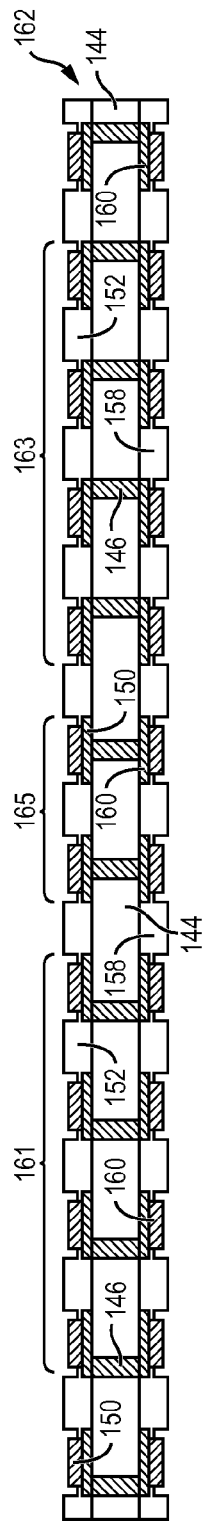

In FIG. 5d, carrier 154 and interface layer 156 are removed by chemical etching, mechanical peeling, CMP, mechanical grinding, thermal bake, UV light, laser scanning, or wet stripping to expose a surface of substrate 144, including insulating layer 152 and conductive layer 150. The interposer or substrate 162 provides electrical interconnect vertically and laterally across the substrate through conductive layers 150 and 160 and conductive vias 146 according to the electrical function of semiconductor die 124. An upper surface of substrate 162 has die attach areas 161 and 163 designated for mounting semiconductor die 124.

Figure 6A:
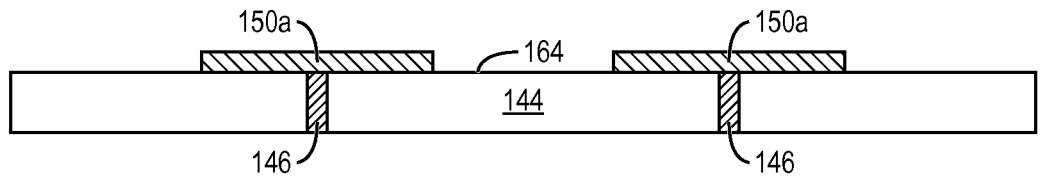
FIGS. 6a-6f illustrate a process of forming the conductive layers with extended length.

FIGS. 6a-6f show a portion of substrate 162 with further detail of the formation of conductive layers 150 and 160, e.g., in area 165. In FIG. 6a, conductive layer 150a is formed over surface 164 of substrate 144 and conductive vias 146 using a patterning and metal deposition process such as printing, PVD, CVD, sputtering, electrolytic plating, and electroless plating. Conductive layer 150a can be one or more layers of Al, Cu, Sn, Ni, Au, Ag, or other suitable electrically conductive material. Conductive layer 150a is electrically connected to conductive vias 146.

Figure 6B:
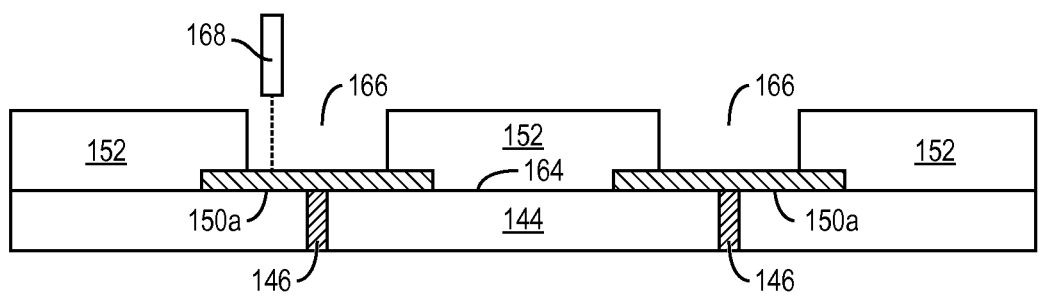

In FIG. 6b, insulating layer 152 is formed over substrate 144 and conductive layer 150a using printing, spin coating, or spray coating. A portion of insulating layer 152 over conductive layer 150a is removed by an etching process through a patterned photoresist layer to form patterned openings 166 and expose conductive layer 150a. Alternatively, a portion of insulating layer 152 is removed by laser direct ablation (LDA) using laser 168 to form patterned openings 166 and expose conductive layer 150a. In one embodiment, patterned openings 166 have a circular cross-sectional area with a cylindrical shape including a circular cross-section. In another embodiment, patterned openings 166 have a rectangular cross-sectional area with a cubic shape including a rectangular cross-section.

Figure 6C:
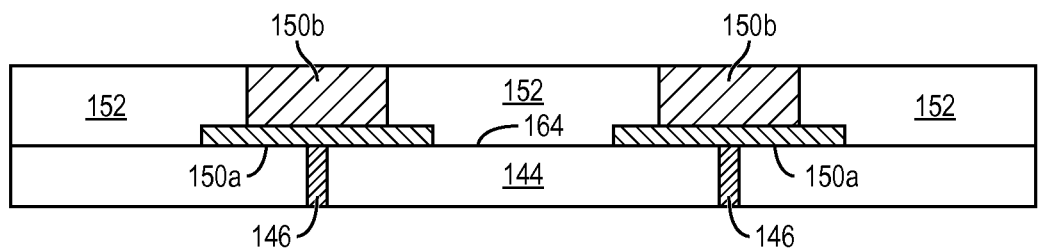

In FIG. 6c, an electrically conductive layer 150b is formed over conductive layer 150a within openings 166, using a patterning and metal deposition process such as printing, PVD, CVD, sputtering, electrolytic plating, and electroless plating. Conductive layer 150b can be one or more layers of Al, Cu, Sn, Ti, Ni, Au, Ag, or other suitable electrically conductive material. In one embodiment, conductive layer 150b is a multi-layer stack including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, or CrCu, or other suitable material. The adhesion layer can be Ti, TiN, TiW, Al, or chromium (Cr), or other suitable material.

Figure 6D:
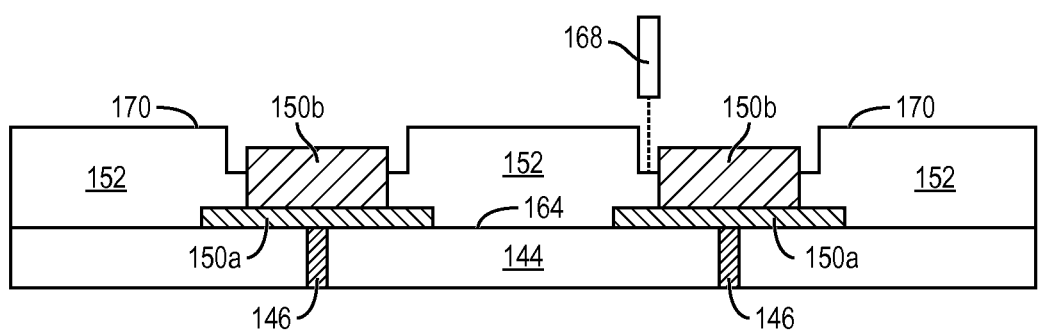
Figure 6E:
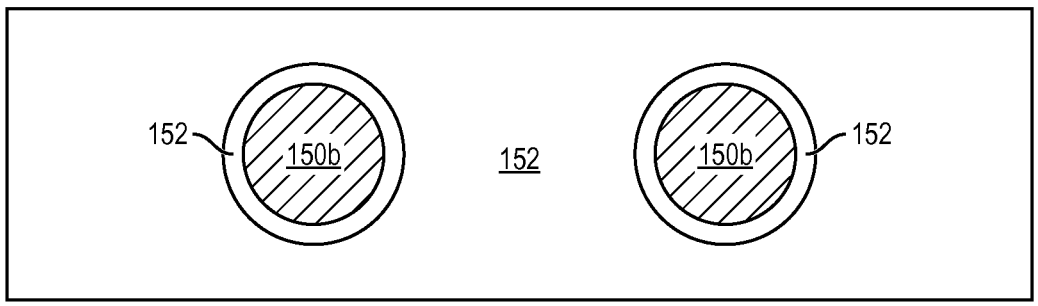

In FIG. 6d, a portion of insulating layer 152 and conductive layer 150b is removed by an etching process through a patterned photoresist layer. Alternatively, a portion of insulating layer 152 is removed by LDA using laser 168. The removal of a portion of conductive layer 150b leaves the conductive layer below surface 170 of insulating layer 152. The removal of a portion of insulating layer 152 exposes side surfaces of conductive layer 150b. FIG. 6e shows a plan view of conductive layers 150b and insulating layer 152.

Figure 6F:
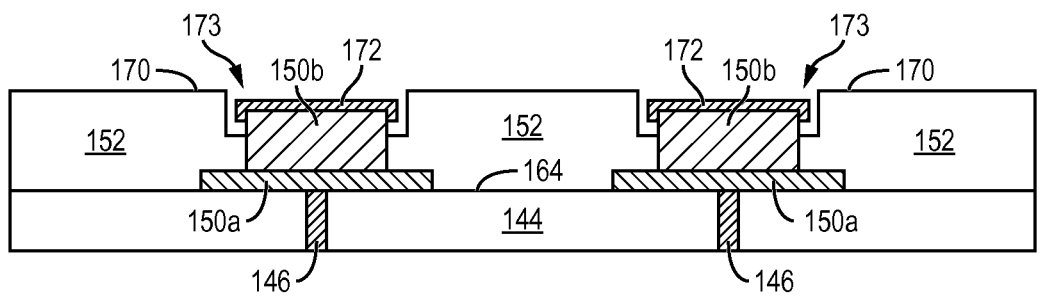

In FIG. 6f, an electrically conductive layer 172 is formed over the exposed conductive layer 150b using a patterning and metal deposition process such as printing, PVD, CVD, sputtering, electrolytic plating, and electroless plating. Conductive layer 172 can be one or more layers of Al, Cu, Sn, Ti, Ni, Au, Ag, or other suitable electrically conductive material. Conductive layer 172 operates as a surface finish for conductive layer 150b. In one embodiment, conductive layer 172 can be organic solderability preservatives (OSP), NiAu, or immersion tin (IT).

The process shown for the formation of conductive layer 150 is applied to conductive layer 160 of substrate 162. The interconnect surface 173 of conductive layers 150 and 160 is non-linear with an extended contact surface area or length, i.e., the interconnect contact surface occurs along side surfaces and horizontal surfaces of the conductive layer. The extended length interconnect surface 173 of conductive layers 150 and 160 reduces cracking between the conductive layer and later formed bumps.

Figure 7A:
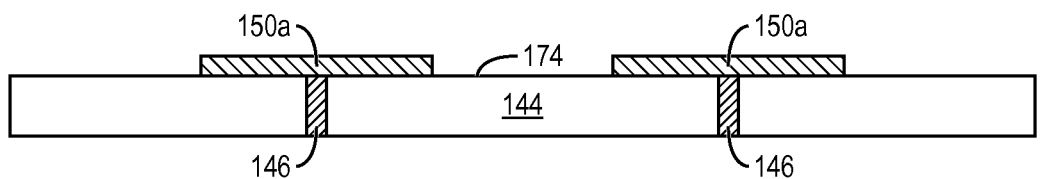
FIGS. 7a-7f illustrate a process of forming stepped conductive layers with extended length.

FIGS. 7a-7f show another embodiment of the formation of conductive layers 150 and 160 in area 165 of substrate 162. In FIG. 7a, conductive layer 150a is formed over surface 174 of substrate 144 and conductive vias 146 using a patterning and metal deposition process such as printing, PVD, CVD, sputtering, electrolytic plating, and electroless plating. Conductive layer 150a can be one or more layers of Al, Cu, Sn, Ni, Au, Ag, or other suitable electrically conductive material. Conductive layer 150a is electrically connected to conductive vias 146.

Figure 7B:
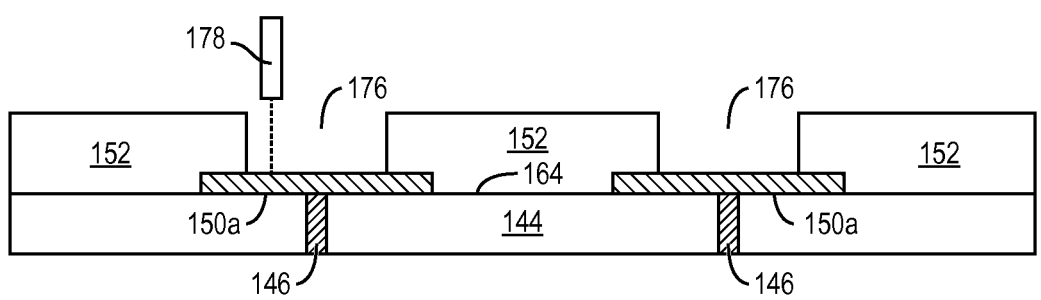

In FIG. 7b, insulating layer 152 is formed over substrate 144 and conductive layer 150a using printing, spin coating, or spray coating. A portion of insulating layer 152 over conductive layer 150a is removed by an etching process through a patterned photoresist layer to form patterned openings 176 and expose conductive layer 150a. Alternatively, a portion of insulating layer 152 is removed by LDA using laser 178 to form patterned openings 176 and expose conductive layer 150a. In one embodiment, patterned openings 176 have a circular cross-sectional area with a cylindrical shape including a circular cross-section. In another embodiment, patterned openings 176 have a rectangular cross-sectional area with a cubic shape including a rectangular cross-section.

Figure 7C:
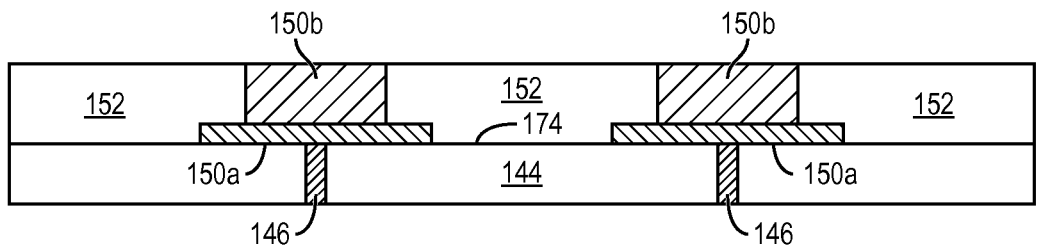

In FIG. 7c, an electrically conductive layer 150b is formed over conductive layer 150a within openings 176, using a patterning and metal deposition process such as printing, PVD, CVD, sputtering, electrolytic plating, and electroless plating. Conductive layer 150b can be one or more layers of Al, Cu, Sn, Ti, Ni, Au, Ag, or other suitable electrically conductive material. In one embodiment, conductive layer 150b is a multi-layer stack including a seed layer, barrier layer, and adhesion layer. The seed layer can be TiCu, TiWCu, or TaNCu. The barrier layer can be Ni, NiV, Pt, Pd, TiW, or CrCu, or other suitable material. The adhesion layer can be Ti, TiN, TiW, Al, or Cr, or other suitable material.

Figure 7D:
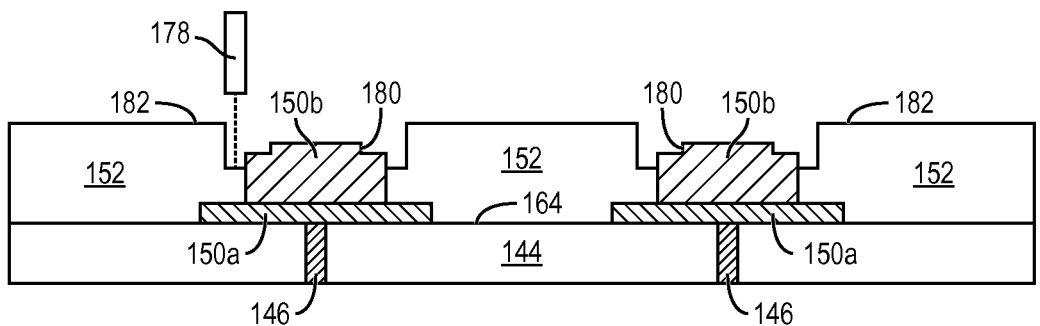
Figure 7E:
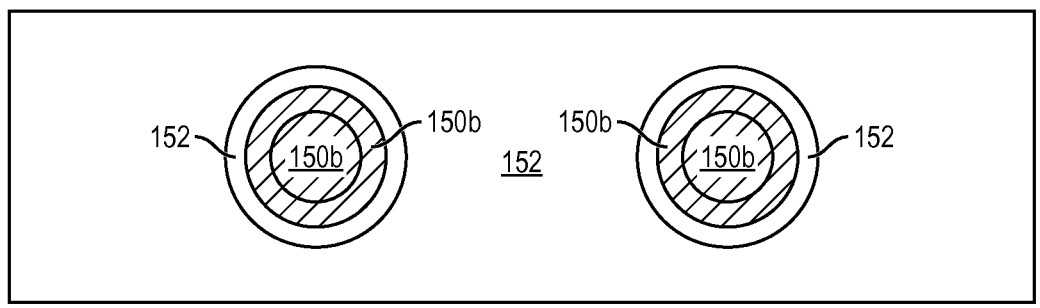

In FIG. 7d, a portion of insulating layer 152 and conductive layer 150b is removed by an etching process through a patterned photoresist layer. Alternatively, a portion of insulating layer 152 is removed by LDA using laser 178. The removal of a portion of conductive layer 150b leaves the conductive layer with a non-linear stepped surface 180 below surface 182 of insulating layer 152. The non-linear stepped surface 180 provides additional surface contact area. The removal of a portion of insulating layer 152 exposes side surfaces of conductive layer 150b. FIG. 7e shows a plan view of the stepped conductive layers 150b and insulating layer 152.

Figure 7F:
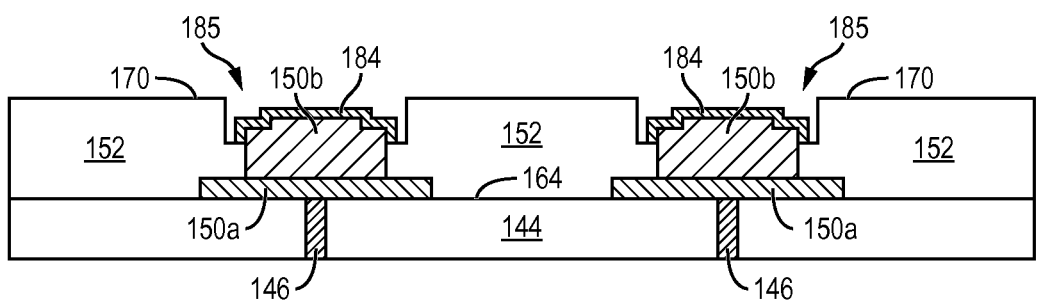

In FIG. 7f, an electrically conductive layer 184 is formed over the exposed conductive layer 150b using a patterning and metal deposition process such as printing, PVD, CVD, sputtering, electrolytic plating, and electroless plating. Conductive layer 184 can be one or more layers of Al, Cu, Sn, Ti, Ni, Au, Ag, or other suitable electrically conductive material. Conductive layer 184 operates as a surface finish for conductive layer 150b. In one embodiment, conductive layer 184 can be OSP, NiAu, or IT.

The process shown for the formation of conductive layer 150 is applied to conductive layer 160 of substrate 162. The interconnect surface 185 of conductive layers 150 and 160 is non-linear with an extended contact surface area or length, i.e., the interconnect occurs along side surfaces and horizontal surfaces of the conductive layer. The extended length interconnect surface 185 of conductive layers 150 and 160 reduces cracking between the conductive layer and later formed bumps.

Figure 8A:
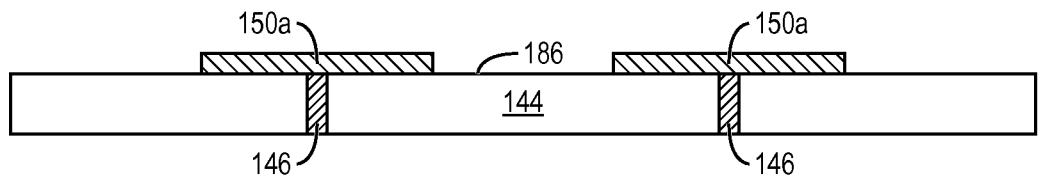
FIGS. 8a-8f illustrate a process of forming the conductive layers as a ring with extended length.

FIGS. 8a-8f show another embodiment of the formation of conductive layers 150 and 160 in area 165 of substrate 162. In FIG. 8a, conductive layer 150a is formed over surface 186 of substrate 144 and conductive vias 146 using a patterning and metal deposition process such as printing, PVD, CVD, sputtering, electrolytic plating, and electroless plating. Conductive layer 150a can be one or more layers of Al, Cu, Sn, Ni, Au, Ag, or other suitable electrically conductive material. Conductive layer 150a is electrically connected to conductive vias 146.

Figure 8B:
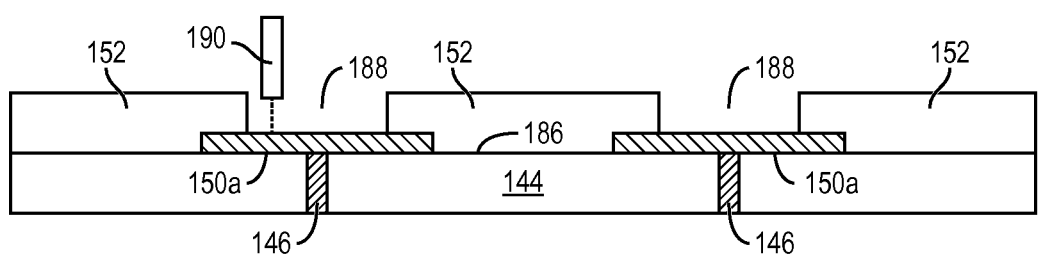

In FIG. 8b, insulating layer 152 is formed over substrate 144 and conductive layer 150a using printing, spin coating, or spray coating. A portion of insulating layer 152 over conductive layer 150a is removed by an etching process through a patterned photoresist layer to form patterned openings 188 and expose conductive layer 150a. Alternatively, a portion of insulating layer 152 is removed by LDA using laser 190 to form patterned openings 188 and expose conductive layer 150a. In one embodiment, patterned openings 188 have a circular cross-sectional area with a cylindrical shape including a circular cross-section. In another embodiment, patterned openings 188 have a rectangular cross-sectional area with a cubic shape including a rectangular cross-section.

Figure 8C:
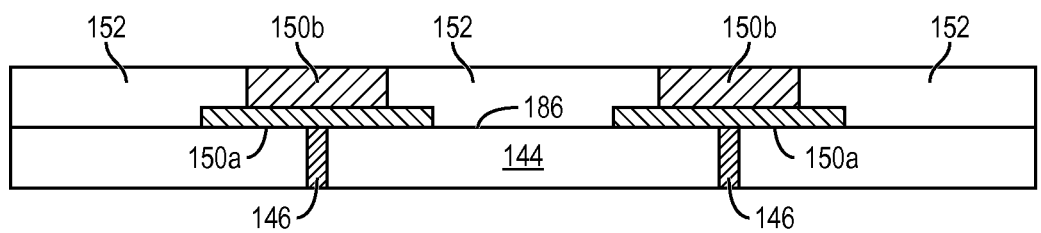

In FIG. 8c, an electrically conductive layer 150b is formed over conductive layer 150a within openings 188, using a patterning and metal deposition process such as printing, PVD, CVD, sputtering, electrolytic plating, and electroless plating. Conductive layer 150b can be one or more layers of Al, Cu, Sn, Ti, Ni, Au, Ag, or other suitable electrically conductive material. In one embodiment, conductive layer 150b is a multi-layer stack including a seed layer, barrier layer, and adhesion layer. The seed layer can be TiCu, TiWCu, or TaNCu. The barrier layer can be Ni, NiV, Pt, Pd, TiW, or CrCu, or other suitable material. The adhesion layer can be Ti, TiN, TiW, Al, or Cr, or other suitable material.

Figure 8D:
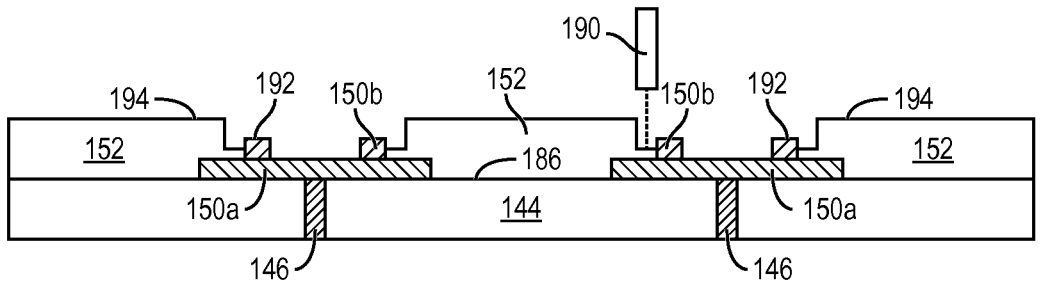
Figure 8E:
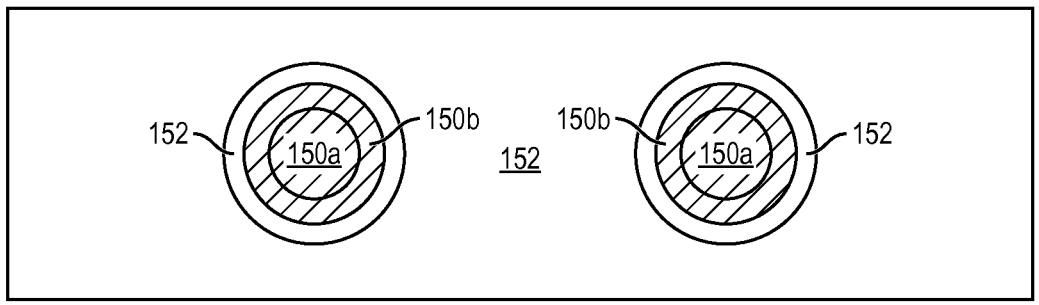

In FIG. 8d, a portion of insulating layer 152 and conductive layer 150b is removed by an etching process through a patterned photoresist layer. Alternatively, a portion of insulating layer 152 is removed by LDA using laser 190. The removal of a portion of conductive layer 150b leaves the conductive layer as a ring 192 below surface 194 of insulating layer 152. The ring 192 provides additional surface contact area. The removal of a portion of insulating layer 152 exposes side surfaces of conductive layer 150b. FIG. 8e shows a plan view of conductive layers 150a-150b and insulating layer 152.

Figure 8F:
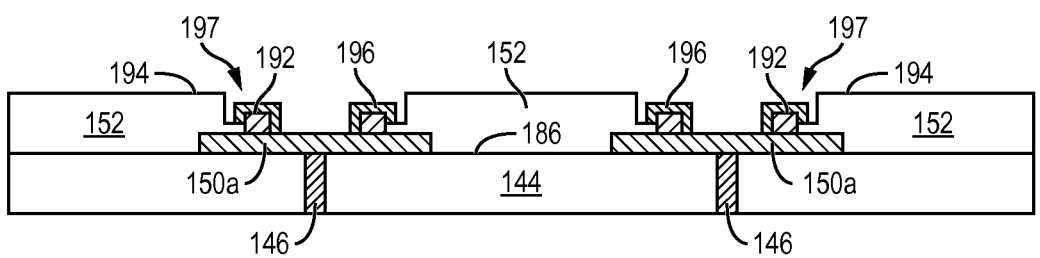

In FIG. 8f, an electrically conductive layer 196 is formed over the exposed conductive layer 150b using a patterning and metal deposition process such as printing, PVD, CVD, sputtering, electrolytic plating, and electroless plating. Conductive layer 196 can be one or more layers of Al, Cu, Sn, Ti, Ni, Au, Ag, or other suitable electrically conductive material. Conductive layer 196 operates as a surface finish for conductive layer 150b. In one embodiment, conductive layer 196 can be OSP, NiAu, or IT.

The process shown for the formation of conductive layer 150 is applied to conductive layer 160 for substrate 162. The interconnect surface 197 of conductive layers 150 and 160 is non-linear with an extended contact surface area or length, i.e., the interconnect occurs along side surfaces and horizontal surfaces of the conductive layer. The extended length interconnect surface 197 of conductive layers 150 and 160 reduces cracking between the conductive layer and later formed bumps.

In FIG. 9a, semiconductor die 124 from FIGS. 4a-4c are aligned to die attach areas 161 and 163 and mounted to substrate 162 by reflowing bumps 134 to metallurgically and electrically connect the bumps to conductive layer 150. FIG. 9b shows semiconductor die 124 mounted to die attach areas 161 and 163 of substrate 162. Bumps 134 fill the entire gap around the side surfaces and horizontal surface of conductive layer 150b for greater contact surface area. Bumps 134 are electrically connected to conductive layers 150 and 160 and conductive vias 146 in accordance with the electrical design and function of semiconductor die 124.

In FIG. 9c, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 198. In some applications, bumps 198 are reflowed a second time to improve electrical contact to conductive layer 160. Bumps 198 fill the entire gap around the side surfaces and horizontal surface of conductive layer 160b for greater contact surface area. Bumps 198 can also be compression bonded to conductive layer 160. Bumps 198 represent one type of interconnect structure that can be formed over conductive layer 160. The interconnect structure can also use stud bump, micro bump, or other electrical interconnect.

The assembly is singulated through substrate 162 with saw blade or laser cutting tool 200 into individual semiconductor package 202.

Figure 10A:
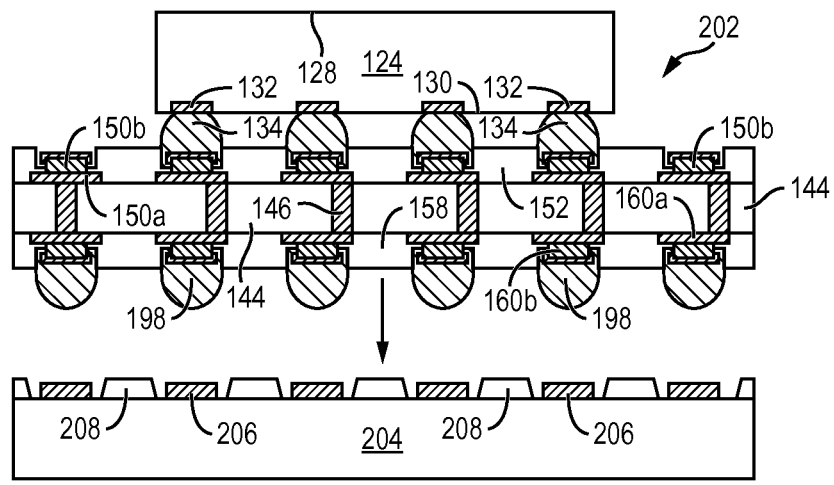
FIGS. 10a-10b illustrate mounting the substrate with the extended length conductive layers to a PCB.
Figure 10B:
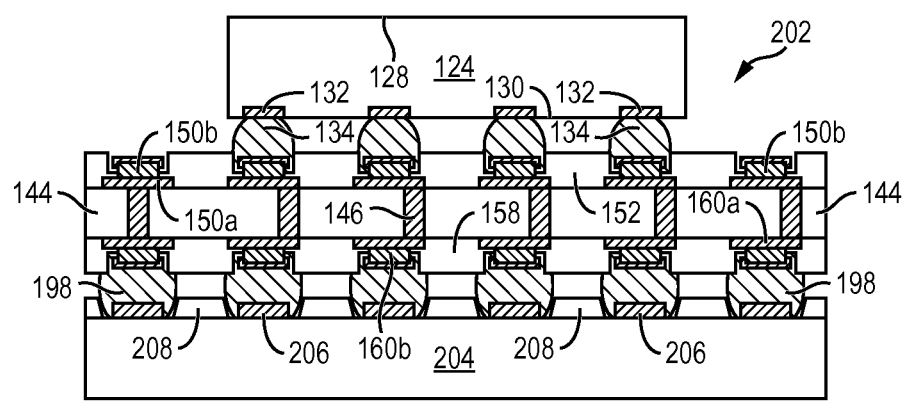

FIG. 10a shows semiconductor package 202 positioned over substrate or PCB 204 with bumps 198 aligned with conductive layer 206 exposed from photoresist layer 208. In one embodiment, substrate 204 is a non-solder mask defined (NSMD) substrate. FIG. 10b shows semiconductor package 204 mounted to substrate 204 with bumps 198 metallurgically and electrically connected to conductive layer 206. Semiconductor die 124 is electrically connected to substrate 204 through bumps 134, conductive layers 150 and 160, conductive vias 146, and bumps 198. The formation of conductive layers 150 and 160 provides an extended length contact surface area for bumps 134 and 198 to enhance reliability, particularly for applications having reduced interconnect pitch such as surface mount devices (SMD). The interconnect surface between conductive layers 150 and 160 and bumps 134 and 198 is non-linear with an extended contact surface area or length, i.e., the interconnect between conductive layer 150 and bumps 134 and between conductive layer 160 and bumps 198 occurs along side surfaces and horizontal surfaces of the conductive layer. The extended length interconnect surface between conductive layers 150 and 160 and bumps 134 and 198 reduces cracking.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate including a first conductive layer;
   forming an insulating layer over the first substrate;
   forming a second conductive layer within an opening of the insulating layer; and
   removing a portion of the second conductive layer to leave a nonlinear surface of the second conductive layer below a surface of the insulating layer.

2. The method of claim 1, further including:
   providing a semiconductor die including a plurality of bumps; and
   disposing the semiconductor die over the first substrate with the bumps covering the second conductive layer.

3. The method of claim 2, further including:
   providing a second substrate; and
   disposing the first substrate and semiconductor die over the second substrate.

4. The method of claim 1, further including removing a portion of the insulating layer from a horizontal surface.

5. The method of claim 1, further including forming the second conductive layer including a ring shape.

6. The method of claim 1, further including forming a third conductive layer over the second conductive layer.

7. A method of making a semiconductor device, comprising:
   providing a substrate;
   forming a first conductive layer over the substrate;
   forming an insulating layer over the first conductive layer; and
   forming a second conductive layer within an opening of the insulating layer and below a surface of the insulating layer, the second conductive layer including a non-linear surface extending a contact area of the second conductive layer.

8. The method of claim 7, wherein forming the second conductive layer includes removing a portion of the second conductive layer to form the non-linear surface of the second conductive layer.

9. The method of claim 7, further including:
   providing a semiconductor die including a plurality of bumps; and
   disposing the semiconductor die over the substrate with the bumps covering the second conductive layer.

10. The method of claim 7, further including forming the second conductive layer with stepped surfaces.

11. The method of claim 7, further including forming the second conductive layer including a ring shape.

12. The method of claim 7, further including forming a third conductive layer over the second conductive layer.

13. The method of claim 7, further including forming the opening in the insulating layer using laser direct ablation.

14. A method of making a semiconductor device, comprising:
   providing a substrate including a conductive via;
   forming an insulating layer over the substrate;
   forming a first conductive layer within a first opening of the insulating layer over the conductive via and below a top surface of the insulating layer; and
   forming a second opening between a side surface of the insulating layer and a side surface of the first conductive layer.

15. The method of claim 14, wherein forming the first conductive layer further includes removing a portion of the first conductive layer to form a non-linear surface of the first conductive layer.

16. The method of claim 15, further including:
   providing a semiconductor die including a plurality of bumps; and
   disposing the semiconductor die over the substrate with the bumps covering the non-linear surface of the first conductive layer.

17. The method of claim 14, further including removing a portion of the insulating layer to leave the side surface of the first conductive layer below the surface of the insulating layer.

18. The method of claim 14, further including forming the first conductive layer including a ring shape.

19. The method of claim 14, further including forming a second conductive layer over the first conductive layer.

20. The method of claim 14, further including forming the first opening in the insulating layer using laser direct ablation.

21. A semiconductor device, comprising:
   a substrate including a conductive via;
   an insulating layer formed over the conductive via; and
   a first conductive layer formed within a first opening of the insulating layer and below a top surface of the insulating layer, including a second opening formed between a side surface of the insulating layer and a side surface of the first conductive layer.

22. The semiconductor device of claim 21, further including:
   a semiconductor die; and
   a plurality of bumps disposed between the semiconductor die and substrate with the bumps covering the first conductive layer.

23. The semiconductor device of claim 21, wherein the first conductive layer is formed including a ring shape.

24. The semiconductor device of claim 21, further including a second conductive layer formed over the first conductive layer.

* * * * *

UNITED STATES PATENT AND TRADEMARK OFFICE
CERTIFICATE OF CORRECTION

PATENT NO. : 9,117,812 B2  
APPLICATION NO. : 14/138382  
DATED : August 25, 2015  
INVENTOR(S) : JaeHyun Lee et al.

Page 1 of 1

It is certified that error appears in the above-identified patent and that said Letters Patent is hereby corrected as shown below:

In the specification,

In Column 1 please delete lines 12-14.

"The present application is a continuation of U.S. patent application Ser. No. 13/417,034, filed Mar. 9, 2012, which application is incorporated herein by reference."

Signed and Sealed this
Twenty-ninth Day of December, 2015

Michelle K. Lee
*Director of the United States Patent and Trademark Office*